(12) United States Patent
Krames et al.

(10) Patent No.: US 8,080,828 B2
(45) Date of Patent: *Dec. 20, 2011

(54) LOW PROFILE SIDE EMITTING LED WITH WINDOW LAYER AND PHOSPHOR LAYER

(75) Inventors: Michael R. Krames, Los Altos, CA (US); Gerd Mueller, San Jose, CA (US); Oleg Borisovich Shchekin, San Francisco, CA (US); Mark Pugh, Los Gatos, CA (US); Gerard Harbers, Sunnyvale, CA (US); John E. Epler, San Jose, CA (US); Serge Bierhuizen, Santa Rosa, CA (US); Regina Mueller-Mach, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 746 days.

This patent is subject to a terminal disclaimer.

(21) Appl. No.: 11/954,712

(22) Filed: Dec. 12, 2007

(65) Prior Publication Data

US 2008/0315228 A1   Dec. 25, 2008

Related U.S. Application Data

(63) Continuation-in-part of application No. 11/423,419, filed on Jun. 9, 2006, now Pat. No. 7,626,210.

(51) Int. Cl.
  *H01L 33/00* (2010.01)
(52) U.S. Cl. ...... 257/98; 257/99; 257/100; 257/E21.127
(58) Field of Classification Search .................. 257/98, 257/E31.127, 99, 100
See application file for complete search history.

(56) References Cited

U.S. PATENT DOCUMENTS

| | | | |
|---|---|---|---|
| 6,828,596 B2 | 12/2004 | Steigerwald et al. | |
| 6,876,008 B2 | 4/2005 | Bhat et al. | |
| 7,538,359 B2 * | 5/2009 | Eng et al. | 257/98 |
| 7,652,301 B2 * | 1/2010 | Bierhuizen et al. | 257/98 |
| 2002/0063301 A1 | 5/2002 | Hanamoto et al. | |
| 2004/0065886 A1 | 4/2004 | Eliashevich et al. | |
| 2008/0308824 A1 * | 12/2008 | Shchekin et al. | 257/98 |

FOREIGN PATENT DOCUMENTS

| | | |
|---|---|---|
| EP | 1533851 A2 | 5/2005 |
| EP | 1566848 A2 | 8/2005 |
| EP | 1780805 A1 | 5/2007 |
| JP | 57092881 A | 6/1982 |
| KR | 20040028873 A | 4/2004 |
| WO | 2006003930 A1 | 1/2006 |

* cited by examiner

*Primary Examiner* — Samuel Gebremariam (57) ABSTRACT

Low profile, side-emitting LEDs are described that generate white light, where all light is emitted within a relatively narrow angle generally parallel to the surface of the light-generating active layer. The LEDs enable the creation of very thin backlights for backlighting an LCD. In one embodiment, the LED emits blue light and is a flip chip with the n and p electrodes on the same side of the LED. Separately from the LED, a transparent wafer has deposited on it a red and green phosphor layer. The phosphor color temperature emission is tested, and the color temperatures vs. positions along the wafer are mapped. A reflector is formed over the transparent wafer. The transparent wafer is singulated, and the phosphor/window dice are matched with the blue LEDs to achieve a target white light color temperature. The phosphor/window is then affixed to the LED.

20 Claims, 12 Drawing Sheets

LOW PROFILE SIDE EMITTING LED WITH WINDOW LAYER AND PHOSPHOR LAYER

CROSS-REFERENCE TO RELATED APPLICATIONS

This is a continuation-in-part of U.S. application Ser. No. 11/423,419, filed on Jun. 9, 2006 now U.S. Pat. No. 7,626,210, entitled Low Profile Side Emitting LED, incorporated herein by reference.

FIELD OF INVENTION

This invention relates to illumination devices using light emitting diodes (LEDs) and, in particular, to techniques for improving backlights and other similar illumination devices using side-emitting LEDs.

BACKGROUND

Liquid crystal displays (LCDs) are commonly used in cell phones, personal digital assistants (PDAs), laptop computers, desktop monitors, and television applications. One embodiment of the present invention deals with a color, transmissive LCD that requires backlighting, where the backlight may use one or more LEDs emitting white or colored light.

In many small displays, such as for cell phones, PDAs, and other devices, it is important that the display be thin. Further, since such small displays are typically battery operated, it is important that the light from the LED is efficiently coupled to the back of the LCD.

LEDs that emit a majority of light in a direction generally parallel to a circuit board are known and have been used in backlights. It is space-efficient in small devices for the circuit board powering the LEDs to be parallel with the LCD. The side-emitted light is coupled into a side of the backlight waveguide, causing the height of the LED to be a limiting factor in making the backlight thinner.

One type of side-emitting LED is a "top emitting" LED that is packaged so that the LED's light emitting active layer is perpendicular to the board's surface. Side-emitting LEDs have also been created by providing a side-emitting lens over a conventional LED, causing the light to be reflected out only through the sides of the lens. These types of side-emitting LEDs do not have a low profile.

Therefore, lower profile side-emitting LEDs are needed along with an efficient backlight incorporating such LEDs.

SUMMARY

Various LED designs are described herein for creating an improved backlight for backlighting an LCD. The backlight may be also used for other illumination applications. The LEDs are side-emitting, where all light is efficiently emitted within a relatively narrow angle generally parallel to the surface of the light-generating active layer. No lenses are used to create the side emission. The LEDs have a low profile, allowing a backlight to be made very thin.

The LED comprises an n-type layer, a p-type layer, and an active layer sandwiched between the n and p layers. The LED is a flip chip with the n and p electrodes on the same side of the LED.

On the surface of the LED opposite to the electrode side is formed any number of other layers including phosphor layers for wavelength converting the light emitted from the active layer, light scattering layers, waveguide layers, dichroic mirrors, and other layers. A reflector is provided over these other layers so that light impinging on the reflector is reflected back toward the active layer and eventually exits through a side surface of the LED. It is important to provide additional layers between the semiconductor layers and the reflector to increase the side emission area for increased extraction efficiency. The phosphor layers may by red, green, blue, YAG, or a combination of phosphors in a single layer.

The LED is mounted electrode-side down on a submount. The submount is then surface mounted on a printed circuit board coupled to a power supply.

Although a white emission can be obtained using a blue LED with a doped YAG (yellow-green) phosphor layer over the LED, such a white emission has a limited color gamut of only about 70% relative to the NTSC x-y chromaticity space. The color gamut can be raised by using red and green phosphors instead of the doped YAG. For the high correlated color temperatures (CCTs) typically specified for backlights, such a layer(s) of red and green phosphors would be too thin to form as a preformed plate that is then affixed to the LED die. Further, by making the phosphor layer(s) very thin, there is less control over the color emitted by the phosphor layer(s) and the uniformity of the color across the phosphor surface. A solution to this is to combine red and green phosphors in a binder (e.g., silicone) and apply the mixture to a transparent window wafer (e.g., a sapphire wafer) by, for example, spraying, spinning on, or other technique. The phosphor layer(s) can be made thin and have a very uniform thickness due to the wafer scale processing, the smoothness of the wafer surface, the even distribution of the phosphor particles (sub-micron diameters) in the binder, and the deposition characteristics of the binder material.

After curing the binder material, the phosphor on the window is then energized by a blue or UV light from a laser or other source, and the phosphor color emissions (CCTs) at different positions along the wafer are sensed to map the resulting phosphor emission versus position on the wafer. Such correlation is then stored in a memory.

A reflective layer is then formed over the window or over the phosphor, depending on whether the phosphor will be adjacent the LED or separated from the LED by the window.

The window wafer is then diced, and the dice are binned according to their previously sensed color emissions. The blue LED dies are also tested and binned according to their emitted wavelengths. The binned phosphor/window dice are then matched with the binned blue LEDs to achieve a target color temperature, and the phosphor/window dice are affixed to the matched blue LED die, such as by silicone, soft glasses, or other means. The phosphor/window dice may be larger than the LED dice so that the edges of the phosphor/window layer extend over the edges of the LED die for increased tolerance in the positioning of the two dice and to reduce direct blue emission around the reflector.

The reflector causes the LED structure to be side-emitting and improves the mixing of light within the window layer.

The red and green phosphor layer(s) on the window layer may be adjacent the LED face or separated from the LED face by the window layer. The window layer thickness can be tailored to maximize extraction efficiency.

Various embodiments of the side-emitting LEDs are described.

The resulting LED has a very low profile since it is a flip chip and uses no lens for its side emission. The LED can emit white light or light of any other color. Although the LEDs used for backlighting are typically non-lasing, in that the LEDs emit incoherent light, the invention may also apply to laser diodes.

A backlight is described where the backlight comprises a thin polymer waveguide with a bottom reflective surface and a top emitting surface. A liquid crystal layer is positioned over the top surface of the waveguide. A generally square side-emitting LED is inserted into an opening in the backlight, where the light-emitting sides of the LED are at approximately 45 degrees relative to a reflective rear sidewall of the waveguide. The light emitted from the LED is efficiently coupled to the waveguide and is reflected out through the top of the waveguide to the liquid crystal layer.

BRIEF DESCRIPTION OF THE DRAWINGS

Elements that are similar or identical in the various figures are labeled with the same numeral.

DETAILED DESCRIPTION

Embodiments of the present invention comprise low profile side-emitting LEDs that enable the construction of thin backlights for LCD applications and other applications.

Figure 1:
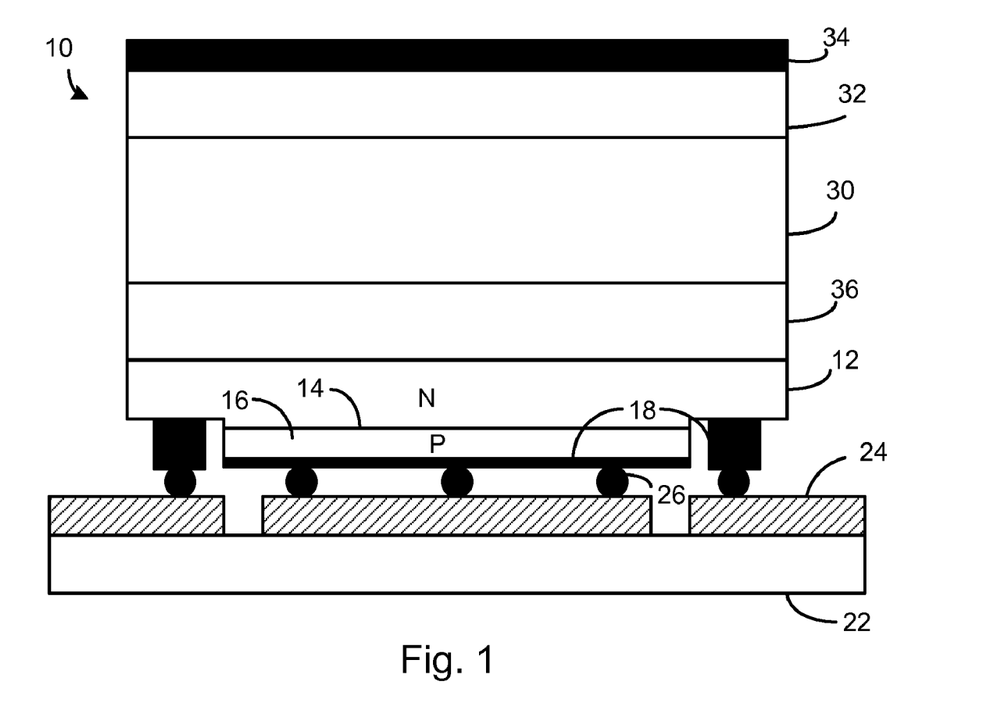
FIG. 1 is a side view of an LED in accordance with a first embodiment of the invention.

FIG. 1 is a side view of a first embodiment of a side-emitting LED 10. In one embodiment, the thickness of the side light emitting surface is 0.1-0.4 mm. In another embodiment the thickness of the side light emitting surfaces is 0.1-0.6 mm.

The present invention applies to LEDs of any material system, such as AlInGaP (typically for emitting red to yellow) or GaN (typically for emitting green to UV). An LED is formed on a starting growth substrate, such as sapphire, SiC, or GaAs, depending on the type of LED to be formed. Generally, an n-layer 12 is formed followed by an active layer 14, followed by a p-layer 16. The p-layer 16 is etched to expose a portion of the underlying n-layer 14. Reflective metal electrodes 18 (e.g., silver, aluminum, or an alloy) are then formed over the surface of the LED to contact the n and p layers. When the diode is forward biased, the active layer 14 emits light whose wavelength is determined by the composition of the active layer. Forming such LEDs is well known and need not be described in further detail. Forming LEDs of all visible wavelengths, mounting such LEDs on a submount, and providing power to the LEDs via a PCB are described in U.S. Pat. No. 6,828,596 to Steigerwald et al. and U.S. Pat. No. 6,876,008 to Bhat et al., both assigned to the present assignee and incorporated herein by reference.

The semiconductor layers of the LED will typically have a total thickness of less than 100 microns (0.1 mm).

The LED is then mounted on a submount 22 as a flip chip. The submount 22 contains metal electrodes 24 that are soldered or ultrasonically welded to the metal 18 on the LED via solder balls 26. Other types of bonding can also be used. The submount electrodes 24 are electrically connected (e.g., by through holes) to pads on the bottom of the submount so the submount can be surface mounted to a printed circuit board coupled to a power supply. The submount 22 may be formed of any suitable material, such as ceramic, silicon, aluminum, etc. If the submount material is conductive, an insulating layer is formed over the substrate material, and the metal electrode pattern is formed over the insulating layer. The submount 22 acts as a mechanical support, provides an electrical interface between the delicate n and p electrodes on the LED chip and a power supply, and provides heat sinking. If multiple LEDs are used as a light source, the submount may also provide interconnections between the LEDs. Submounts are well known.

To cause the LED 10 to have a very low profile, and to prevent light from being absorbed by the growth substrate, the growth substrate may be removed, such as by laser lift-off, CMP, etching, or other technique. Suitable substrate removal techniques are described in U.S. Pat. No. 7,256,483, entitled, Package-Integrated Thin Film LED, by John Epler et al., incorporated herein by reference. In one embodiment, removal of the growth substrate is performed after the LEDs are mounted on their submounts and prior to the LEDs and submounts being diced.

After the growth substrate is optionally removed, optical elements are formed over the n-layer 12 that enhance the side emission of the LED 10. In one embodiment, the optical elements include a clear wave guiding layer 30, a scattering layer 32 incorporating reflective particles or a roughed/prism surface, and a top reflective layer 34. The wave guiding layer 30 may be formed of any suitable transparent or translucent organic or inorganic material. A lower layer 36 may be a dichroic mirror or a one-way mirror so that light downwardly reflected by reflective layer 34 is not absorbed by the semiconductor layers.

If the growth substrate is transparent, such as sapphire, the optical layers may be formed over the growth substrate, where the sapphire substrate acts as a waveguide. The growth substrate may also be reduced in thickness without being totally removed.

The layers may include a planar phosphor layer for converting the wavelength of the light emitted from the active layer 14. A planar phosphor layer may be preformed as a ceramic sheet and affixed to the LED layers, or the phosphor particles may be thin-film deposited, such as by electrophoresis. If a phosphor layer is used, the active layer 14 will typically emit blue or UV light, and the phosphor will convert the wavelength to one or more other colors to create white light or another color. Other embodiments using phosphor are described below.

The reflector 34 may be specular or diffusing. A specular reflector may be a distributed Bragg reflector (DBR) formed of organic or inorganic layers. The specular reflector may also be a layer of aluminum or other reflective metal, or a combination of DBR and metal. A diffusing reflector may be formed of a metal deposited on a roughed surface or a diffusing material such as a suitable white paint.

In another embodiment, there is only a single waveguide layer between the n-layer 12 and the reflector 34.

Virtually all light emitted by the active layer 14 is either directly emitted through the sides of the LED, or emitted through the sides after one or more internal reflections, where the sides are substantially perpendicular to the major surface of the active layer 14. Light that impinges upon a side of the wave guiding layer 30 that is less than the critical angle will be reflected back into the LED. Therefore, a scattering layer 32 or diffusing reflector 34 generally improves the efficiency of the side emission by causing the light to be reflected at many angles and ultimately at less than the critical angle. Due to such internal reflections, the light output from the LED 10 will be at a small angle relative to the plane of the active layer.

The resulting LED 10 has a very low profile. By making the LED sides thicker, the efficiency will increase. The layers overlying the semiconductor layers should be at least as thick as the semiconductor layers to substantially increase the height of the side emission area. Accordingly, a majority of the light will be emitted through the sides of the layers overlying the semiconductor layers.

Figure 2:
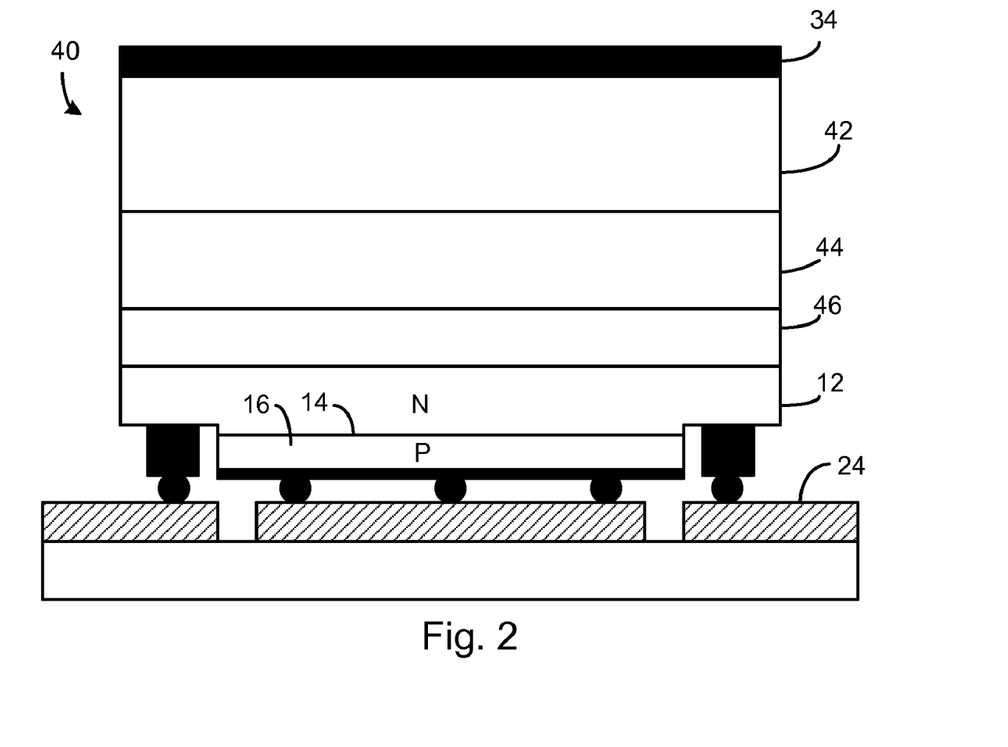
FIG. 2 is a side view of an LED in accordance with a second embodiment of the invention.

FIG. 2 is a side view of a second embodiment of a side-emitting LED 40, where the active layer 14 emits blue light. A phosphor layer 42 of Ce:YAG emits a yellow light when energized by the blue light. The emitted blue light is combined with the yellow light to create white light. The spectrum of the emitted light depends largely on the Ce doping in the phosphor as well as the thickness of the phosphor layer 42. The phosphor layer 42 may be sintered phosphor particles or phosphor particles in a transparent or translucent binder, which may be organic or inorganic. The phosphor layer 42 also scatters the light. Layer 44 is a clear or scattering spacer layer that increases the efficiency of the LED 40 by increasing the area of the sides. The thickness of layer 44 also affects the mix of yellow and blue light emitted by the LED 40. Layer 46 is a dichroic mirror that passes the blue light but reflects back the yellow light. The top reflector 34 ensures all light escapes through the sides.

Figure 3:
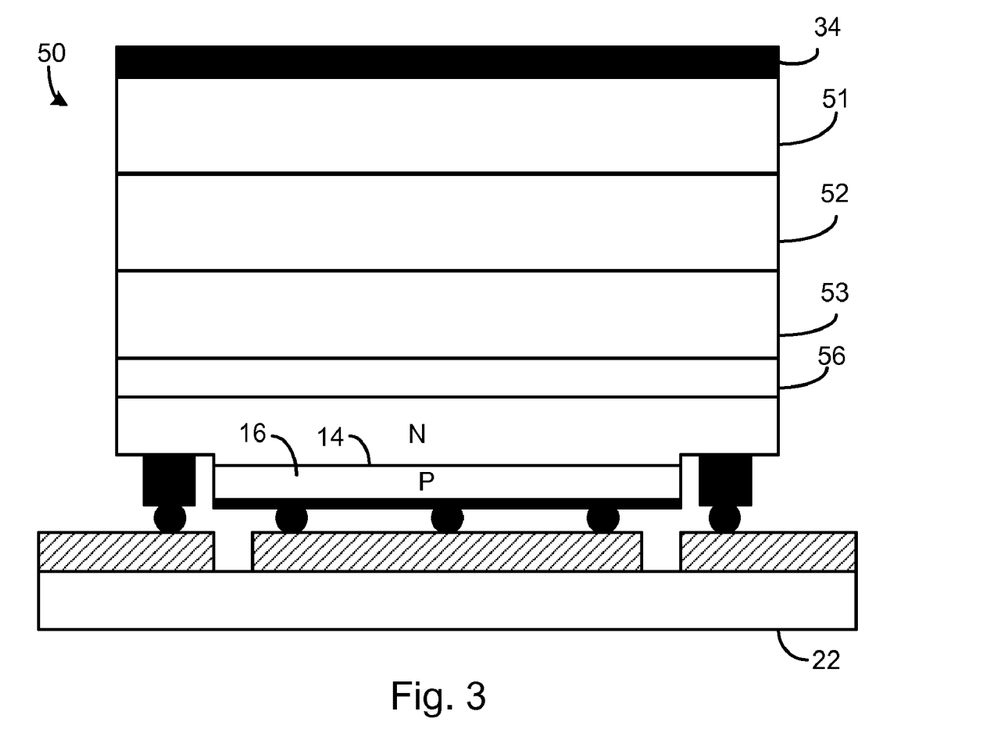
FIG. 3 is a side view of an LED in accordance with a third embodiment of the invention.

FIG. 3 is a side view of a third embodiment of a side-emitting LED 50 that emits white light or any other color of light. The active layer 14 emits blue or UV light. For a UV embodiment, a blue phosphor layer 51, a green phosphor layer 52, and a red phosphor layer 53 are stacked. The phosphor layers may be preformed sintered layers or phosphor particles in a binder. The phosphor layers allow some UV light to pass through to the above layer. Also, the emitted light from an underlying phosphor may energize an overlying phosphor layer. The thicknesses and compositions of the phosphor layers determine the white point of the emitted light.

If the active layer 14 emits blue light, the blue phosphor layer 51 can be omitted or substituted with a transparent or scattering spacer.

The different phosphors may also be mixed into a single layer. All the phosphors mentioned herein are well known types that are commercially available.

A dichroic mirror 56 that passes the active layer light but reflects other wavelengths may be used to prevent absorption of downwardly reflected light by the semiconductor layers.

If the LED 50 were intended to emit just blue light, the various layers may be substituted by non-absorbing optical elements, such as sapphire or silicone, used as waveguides and spacers for increasing efficiency.

Figure 4:
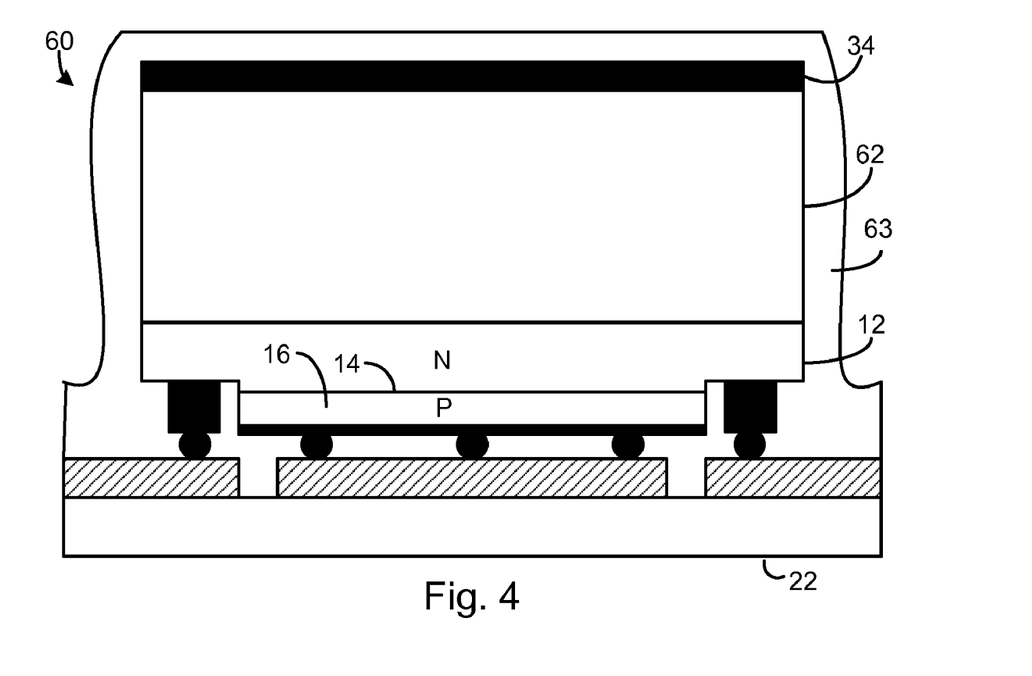
FIG. 4 is a side view of an LED in accordance with a fourth embodiment of the invention.

FIG. 4 is a side view of a fourth embodiment of a side-emitting LED 60. LED 60 emits white light. The active layer 14 emits blue light. A transparent waveguide 62 and reflector 34 causes the blue light to be emitted from the sides of the waveguide 62 and the sides of the semiconductor layers. The LED 60 is coated with a layer of Ce:YAG phosphor 63, which emits yellow light when energized by blue light. The phosphor may be electrophoretically deposited phosphor particles encapsulated in silicone. A portion of the blue light is down-converted by the phosphor to create yellow light, and the blue light and yellow light mix to create white light. Alternatively, the phosphor 63 may be a mixture of red and green phosphors deposited as a slurry or deposited as overlapping layers.

The reflector 34 in all embodiments may be specular or diffusing. As in all embodiments, increasing the area of the sides increases the light extraction efficiency.

Figure 5:
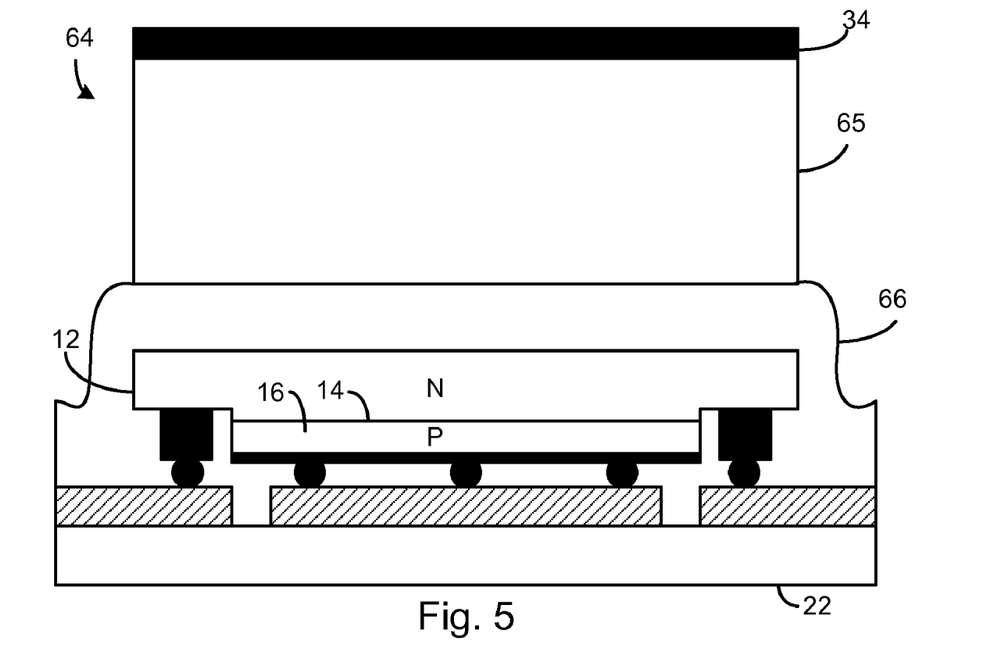
FIG. 5 is a side view of an LED in accordance with a fifth embodiment of the invention.

FIG. 5 is a side view of a fifth embodiment of a side-emitting LED 64, which emits white light. The active layer 14 emits blue light. Prior to forming a clear waveguide layer 65 over the semiconductor layers, the semiconductor layers are covered with a Ce:YAG phosphor layer 66, which may be electrophoretically deposited phosphor particles encapsulated in silicone. The energized phosphor emits yellow light. The blue light mixes with the yellow light so the LED 64 emits white light. The thickness and composition of the phosphor layer 66 determines the mixture of yellow and blue light. Alternatively, the phosphor layer 66 may be a mixture of red and green phosphors deposited as a slurry or deposited as overlapping layers.

Figure 6:
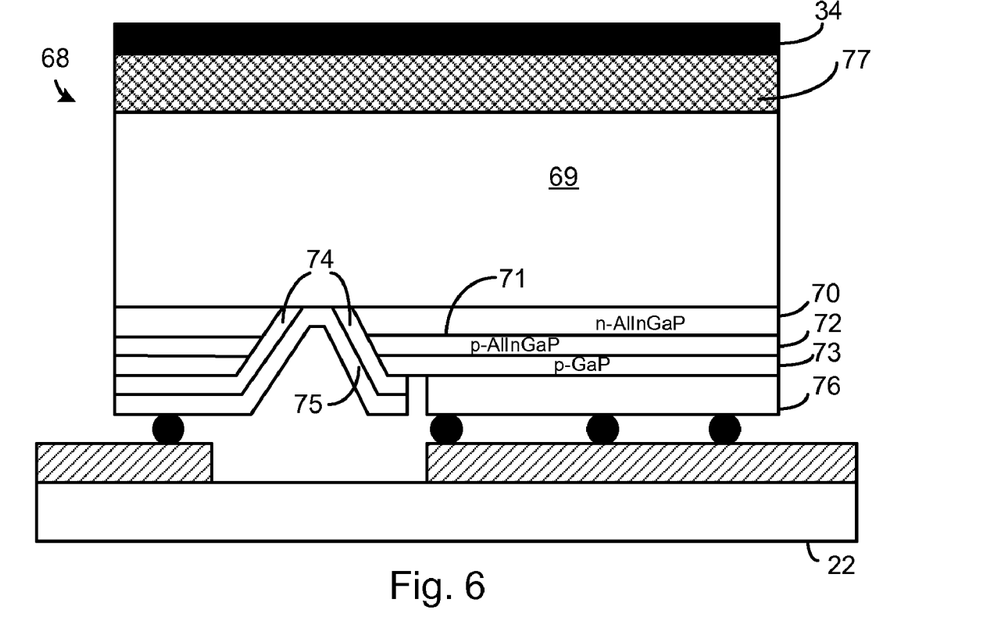
FIG. 6 is a cross-sectional view of an LED in accordance with a sixth embodiment of the invention.

FIG. 6 is a cross-sectional view of a sixth embodiment of a side-emitting LED 68 that generates a red light. The LED comprises a thick n-GaP layer 69 (used as a waveguide), an n-AlInGaP cladding layer 70, an active layer 71, a p-AlInGaP cladding layer 72, and a p-GaP layer 73. The layers are etched to expose a portion of the conductive n-GaP layer 69. A layer of insulation 74 is formed over the sides of the layers 70-74, and a metal layer 75 is then deposited to contact the n-GaP layer 69. A reflective metal layer 76 contacts the p-GaP layer 73. Current through the metal layers 75 and 76 causes the active layer 71 to emit red light.

The top surface 77 of the n-Gap layer 69 is etched to be roughened to scatter light, such as made porous, dimpled, prismed, or any other type of roughening. The roughening may be performed on a wafer scale prior to dicing. Such processing of the surface of the LED may be performed on the other embodiments of LEDs described herein to increase light extraction. The top reflector 34, formed after the etching of the n-GaP layer 69, ensures that all light escapes from the sides. The roughening of the top surface increases the extraction of light from the sides of the chip.

Side emitting flip-chip LEDs provide a number of advantages when used in lighting systems. In backlights, side emitting flip chip LEDs allow utilization of thinner waveguides, fewer LEDs, better illumination uniformity, and higher efficiency due to better coupling of light into a waveguide.

Figure 7:
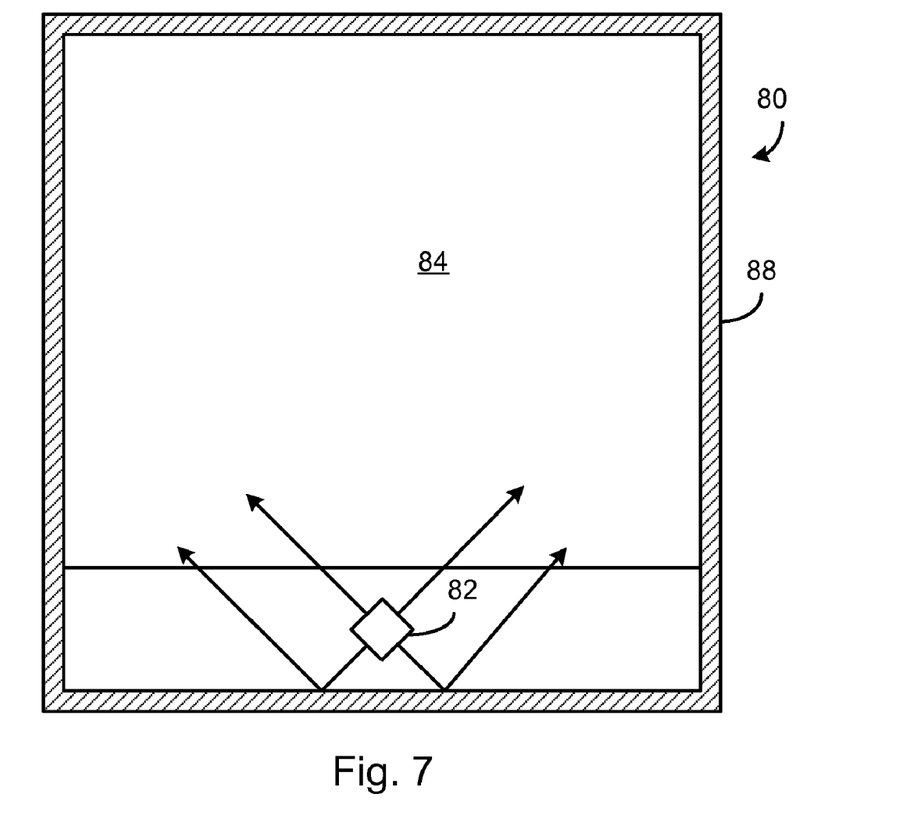
FIG. 7 is a top down view of a thin backlight showing the preferred position of the side-emitting LED.

FIG. 7 is a top down view of a 2-inch display backlight 80 that may be used in a color LCD of a cell phone. A single flip-chip side-emitting LED 82, in accordance with any of the embodiments described herein, is incorporated into the transparent waveguide 84 as shown in FIG. 7. Such a configuration provides very uniform brightness across the backlight. The waveguide 84 may be formed of a polymer. The LED 82 is generally square, and its sides are at approximately 45 degrees relative to the internally reflective surfaces of the waveguide 84.

Figure 8:
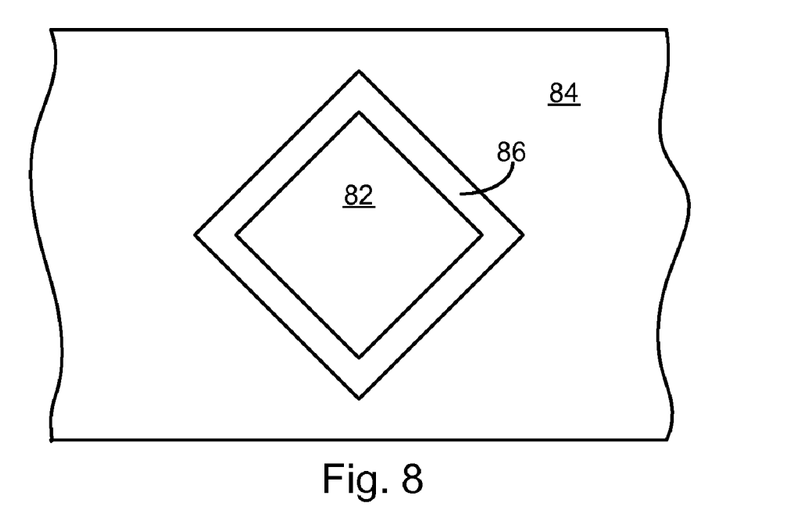
FIG. 8 is a close up view of the LED of FIG. 7 in the backlight.

FIG. 8 is a close up of the LED 82 and the waveguide 84. The waveguide 84 is molded to have a square hole 86 near a back surface. The side walls of the waveguide 84 are coated with a reflective material 88 (FIG. 7). The bottom surface of the waveguide 84 may also be coated with a reflective metal, or the waveguide bottom surface may be angled (like a wedge) so that light is reflected upward by total internal reflection. A small air gap is between the LED 82 and the waveguide material.

Since the LED 82 is at an angle, as shown in FIG. 7, the light emitted from the four sides reflects of the walls of the waveguide 84 and mixes within the waveguide. Since no LED side is parallel to a reflective surface of the waveguide 84, there is no reflection by the waveguide 84 back into the LED.

If light from a conventional LED were simply coupled to a side of the waveguide, the light angle would be compressed by the index of refraction of the waveguide material. Therefore, multiple spaced LEDs would be required and there would be little mixing, resulting in less brightness uniformity across the backlight.

There is a high light-coupling efficiency into the waveguide 84 due to the low profile of the LED 82 and the narrow gap between the LED's emitting surface and the waveguide 84, enabled by the flip-chip structure.

Figure 9:
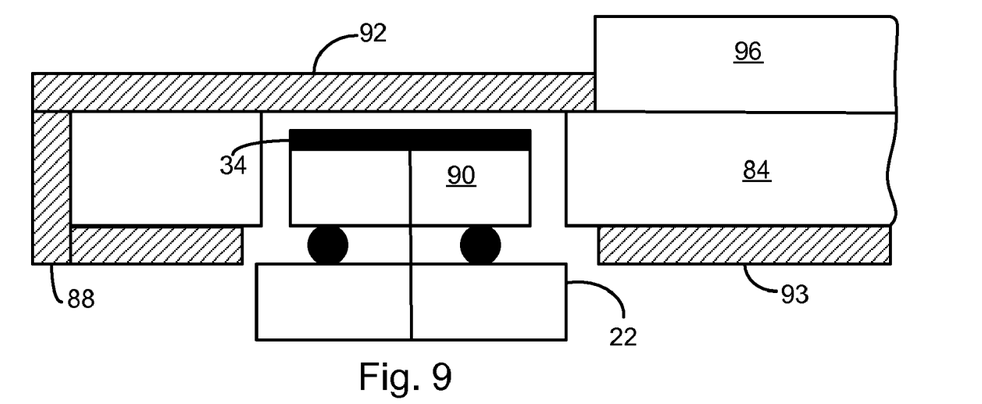
FIGS. 9, 10, and 11 are cutaway side views of different types of LEDs in the backlight of FIG. 7, where the top reflector may be formed directly on the LED or provided by the backlight.
Figure 10:
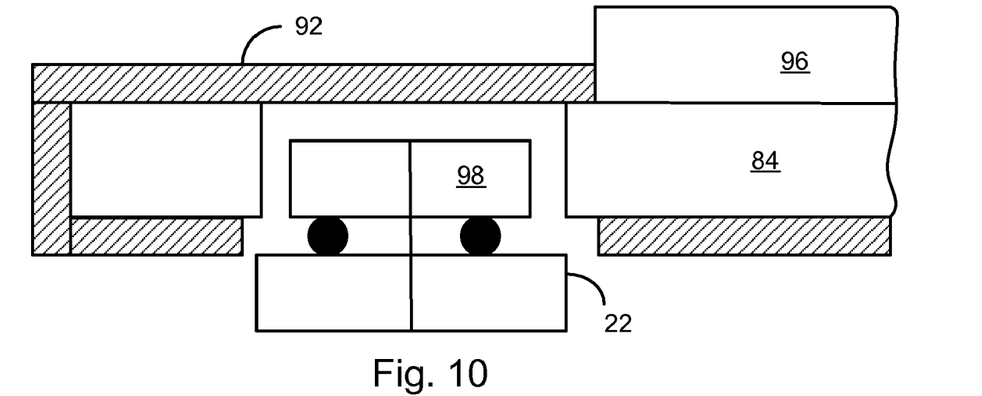
Figure 11:
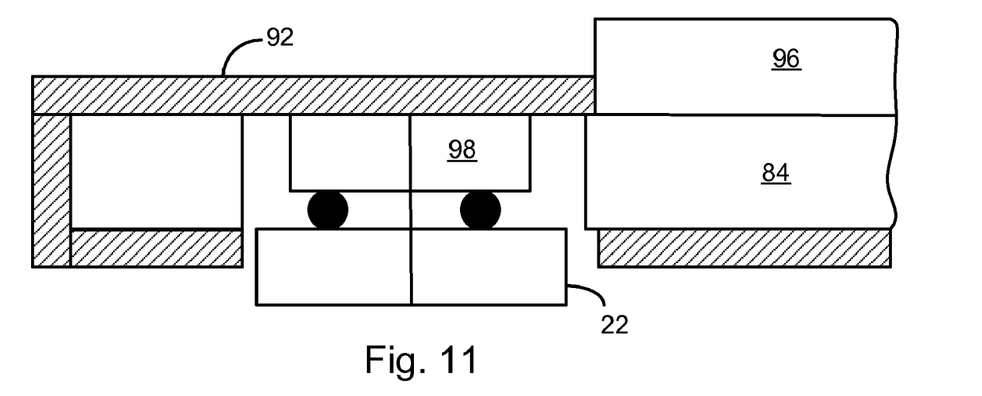

FIGS. 9-11 are cutaway side views of side-emitting LEDs, mounted on submounts, within an opening of the waveguide shown in FIG. 7.

In FIG. 9, the LED 90 has a top reflector 34 so light is emitted from the sides of the LED 90. Reflective metal portions 88, 92, and 93 formed on the non-emitting surfaces of the waveguide 84 cause all light to escape only through the top of the waveguide into the liquid crystal layer 96. Since there are no wire bonds between the LED 90 and the submount 22 and no surrounding materials, such as a lens, there can be a very close spacing or direct contact between the emitting walls of the LED 90 and the waveguide 84. Due to the low profile of the LEDs, the light emitting surface can be 0.1-0.4 mm tall, which is as tall or smaller than the coupling surface of the thin waveguide (e.g., 0.4-0.65 mm). Such a low profile gives a light coupling advantage to the side-emitting LEDs over conventional side-emitting LEDs with emitting surfaces having a height of 0.6 mm or greater.

The completed device of FIG. 9 is a color, transmissive liquid crystal display (LCD), where the backlight emits white light containing red, green, and blue light components.

The liquid crystal layers 96 typically consist of polarizers, RGB filters, a liquid crystal layer, a thin film transistor array layer, and a ground plane layer. The electric fields created at each pixel location, by selectively energizing the thin film transistors at each pixel location, causes the liquid crystal layer to change the polarization of the white light at each pixel location. The RGB filters only allow the red, green, or blue component of the white light to be emitted at the corresponding RGB pixel locations. LCDs are well known and need not be further described.

FIG. 10 illustrates a side emitting LED 98 without a reflective top layer. Instead, the reflective surface 92 of the waveguide causes all light to be redirected sideways into the waveguide portion below the liquid crystal layers 96.

FIG. 11 illustrates the LED 98 with its top surface abutting the reflective surface 92 of the waveguide, resulting in side emission. Using the waveguide's reflector 92 for side emission simplifies manufacturing of the LED. In FIG. 11, the submount 22 is partially inserted into the hole in the waveguide 84.

The side-emitting LED concept is also advantageous for use in compact illuminators, such as for a camera flash, especially a miniature flash in a cell phone camera.

Figure 12:
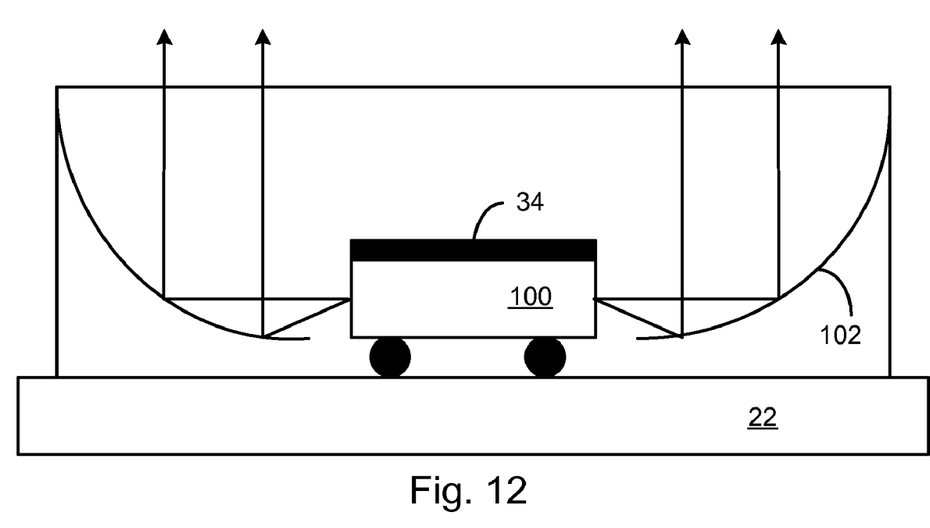
FIG. 12 is a cutaway view of a side-emitting LED mounted in a cup reflector.

FIG. 12 shows how the side-emitted light of LED 100 is collected and redirected by a shaped reflective surface 102, such as a parabolic reflector. The reflector may be an aluminum cup with a center hole for receiving the LED 100. Such an arrangement may be advantageous in a compact flash application for cell phones where a low profile emitter and reflective optics can dramatically reduce package height. The LED 100 emits white light by the use of one or more phosphors, as described with respect to FIGS. 2-5. Prior art flashes for cell phones are typically top-emitting LEDs with a Fresnel lens. The present invention provides advantages over such prior systems and avoids the use of a lens.

Additionally, in prior art flashes using a blue LED with a YAG phosphor, the yellow color of the phosphor is not attractive. The flash design of FIG. 12 avoids visual conspicuity of the YAG phosphor layer, since a reflective layer 34 covers the phosphor. The top reflector 34 even offers design opportunities by allowing choice of color of the top surface of the LED, which can be realized by the attachment of any pigmented surface on top of the reflective layer 34.

In applications of the side-emitting LED where a white light is to generated with a high color gamut, combining a blue LED with a YAG phosphor is not a good solution since its color gamut is only about 70% relative to the NTSC x-y chromaticity space. A higher color gamut is obtained by energizing red and green phosphors by a blue LED and allowing a certain amount of blue light to leak through the phosphor layer. However, when the specified correlated color temperature (CCT) of the white light is relatively high, such as for backlights for color LCD televisions, the red and green phosphor layer must be very thin to allow sufficient blue light to leak through. The required thinness prevents the red and green phosphors being preformed as a plate and then affixed to the LED die due to the structural weakness of the plate. Further, simply coating the blue LED die with thin red and green phosphor layers or a thin mixed layer would create problems in thickness uniformity and phosphor density uniformity. Such nonuniformity would result in poor overall color control and variations in emitted color along the LED.

Figure 16:
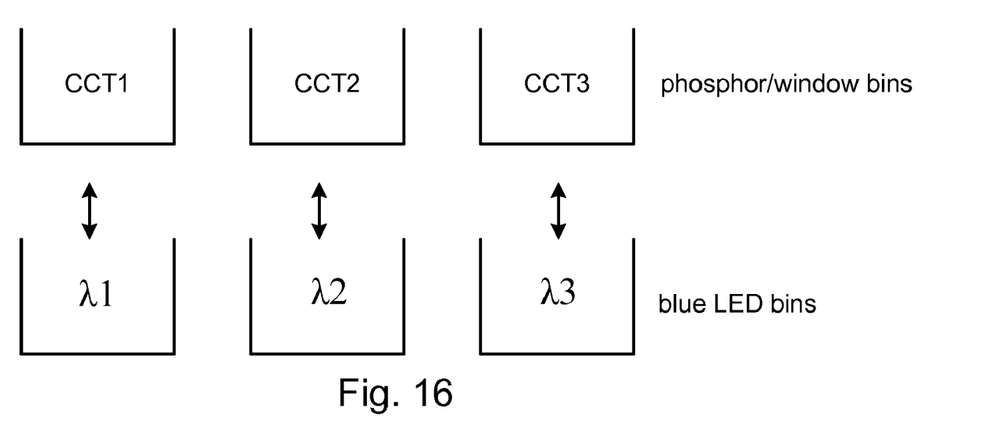
FIG. 16 illustrates binning the phosphor/window dice and blue LEDs according to their color emissions.
Figure 17A:
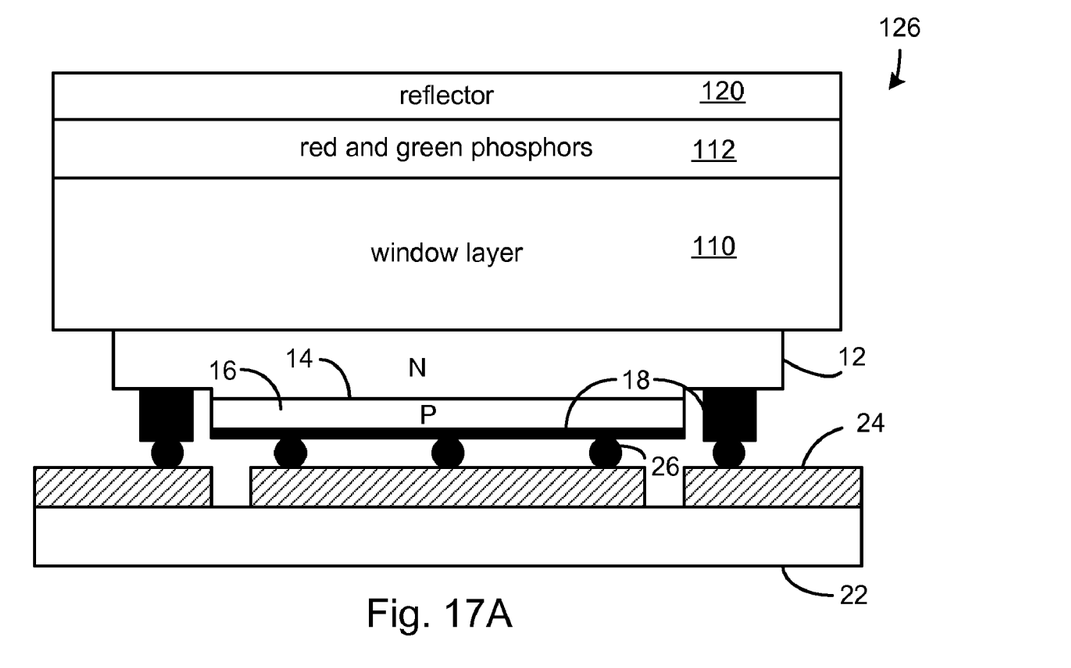
FIG. 17A is a side view illustrating a phosphor/window die, from the wafer of FIG. 15A, affixed to a matched blue LED to achieve a target white point.
Figure 17B:
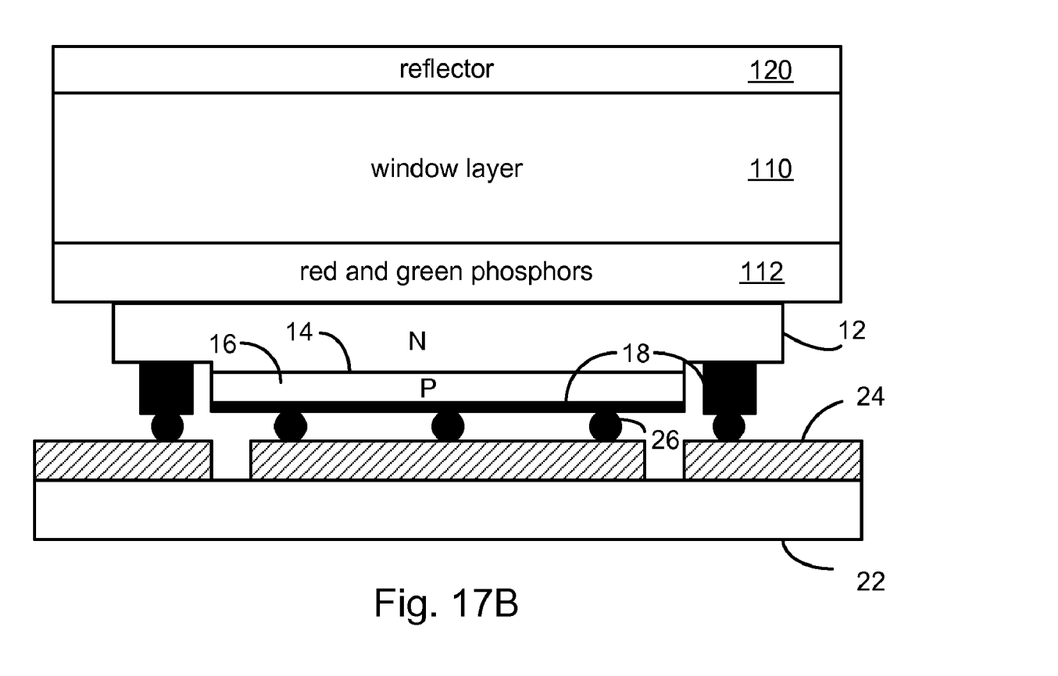
FIG. 17B is a side view illustrating a phosphor/window die, from the wafer of FIG. 15B, affixed to a matched blue LED to achieve a target white point.
Figure 18:
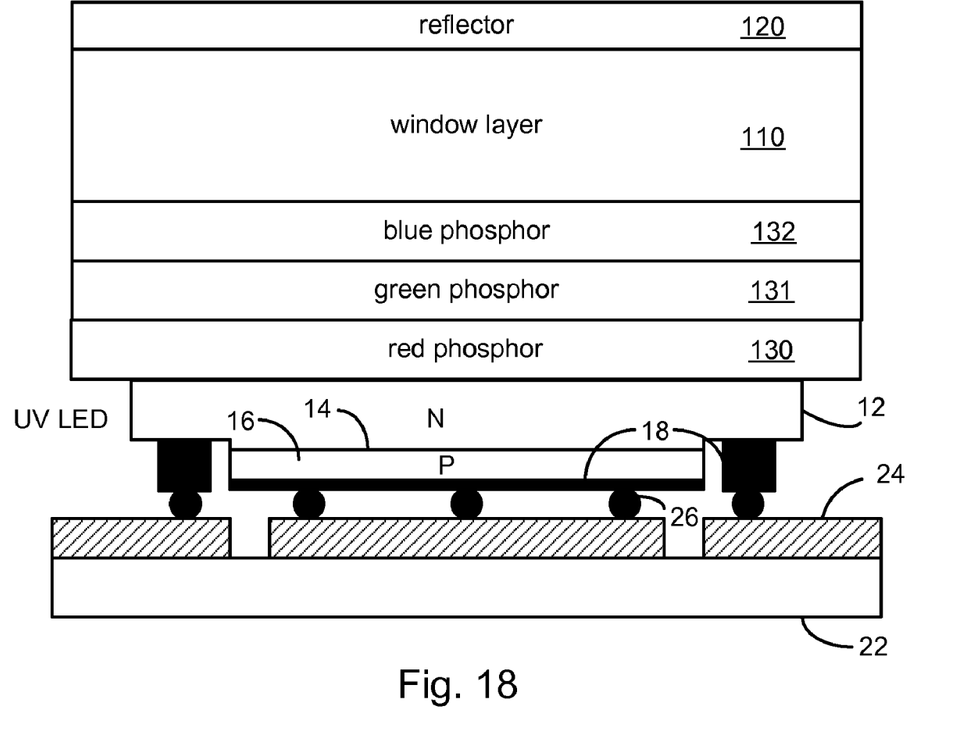
FIG. 18 is a side view illustrating a UV LED with overlying RGB phosphors, a window layer, and a reflector for emitting white light. The phosphor/window die may be fabricated is a manner similar to that shown in FIGS. 13-16.

FIGS. 13-24 present solutions to this problem, where the red and green phosphors in a transparent binder are applied as a thin layer over a transparent window wafer. The window wafer is then singulated, and each phosphor/window die is then affixed to a blue LED. Color gamuts greater than 80% have been shown to be likely using simulations. FIG. 18 illustrates the creation of white light using a UV LED. In the preferred embodiment, a reflector is also formed over the window wafer to create side-emitting LEDs.

Figure 13:
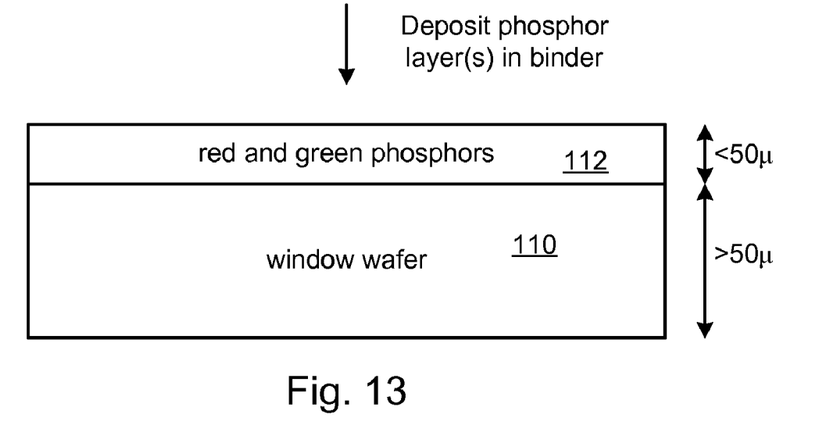
FIG. 13 is a side view of a window wafer with a thin layer of red and green phosphors applied to its surface. The phosphors may be mixed or in overlapping layers.

In FIG. 13, a wafer 110 of a transparent material is provided. This wafer is referred to as a window wafer 110. The wafer 110 is many times larger than a single LED die, and the wafer 110 will later be singulated for attachment of each window die to an LED die. The thickness of the wafer 110 is preferably greater than 100 microns, but is at least 50 microns. Increasing the thickness, up to a point, will increase light extraction due to the increased side surface areas. The wafer 110 may be sapphire, fused silica, undoped YAG or LuAG (or other ceramic), glass, or other suitable material. The wafer may also be formed of a transparent ceramic with light scattering particles in it. The top surface of the wafer 110 is smooth.

In one embodiment, red and green phosphors are mixed in a binder, such as liquid silicone, and the mixture is sprayed onto the wafer surface to achieve the required thickness. Alternatively, the mixture may be deposited on the wafer surface and the wafer spun to achieve the desired thickness. The phosphor particles should have sub-micron diameters to maximize surface area and distribution. The relative densities of the phosphors and the thickness of the mixture depends on the required CCT of the white light. The mixture is then cured, such as with heat or UV light. In one embodiment, the thickness of the phosphor layer 112 is preferably less than 20 microns to allow sufficient blue light to leak through while providing a sufficient density of red and green phosphor to create a uniform white light. Typically, the phosphor layer 112 will be between 10-50 microns. The phosphor layer can be made to have a very uniform thickness due to the wafer scale processing, the smoothness of the wafer surface, the even distribution of the phosphor particles in the binder, and the deposition characteristics of the binder material.

In another embodiment, a layer of red phosphor is first deposited, as described above, and then cured. A layer of green phosphor is then deposited and cured. It is preferable that the shorter wavelength phosphor (green) overlie the longer wavelength phosphor (red) so that a minimum amount of the green light is absorbed by the red phosphor and re-emitted as red light. Separating the layers may improve the control over the relative contributions of the red and green phosphor to achieve the target CCT. The subsequent use of the term "phosphor layer" is intended to refer to a single mixed phosphor layer or multiple phosphor layers.

Figure 14:
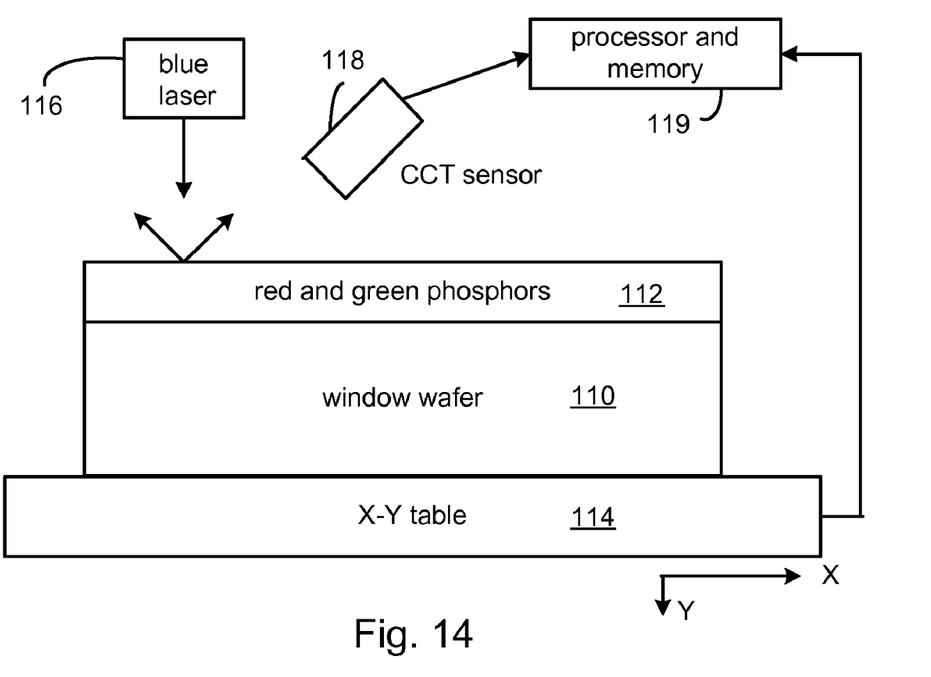
FIG. 14 illustrates testing the phosphor layer of FIG. 13 for color temperature vs. position and storing the results.

In FIG. 14, the wafer 110 is placed on an X-Y positioning table 114, and a beam from a blue laser 116 energizes the red and green phosphor layer 112 a small area at a time. At each position, the resulting light emitted by the phosphors is detected by a CCT sensor 118. A processor and memory 119 maps the phosphor position to the sensed CCT and stores that information. Alternatively, the laser 118 can move instead of the wafer 110. In one embodiment, each area energized substantially corresponds to an area of a phosphor/window die after singulation of the wafer.

Figure 15A:
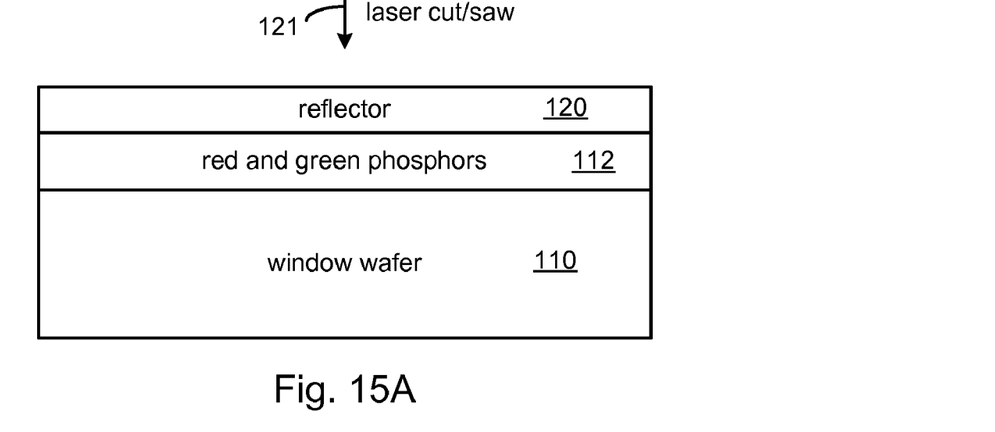
FIG. 15A illustrates the adding of a reflective layer over the phosphor layer and the dicing of the wafer to form phosphor/window dice for bonding onto blue LEDs.

In FIG. 15A, a reflector 120 is then provided over the phosphor layer 112. The reflector 120 may be an adhesive metal foil, a metal (e.g., aluminum or silver) deposited by evaporation or sputtering, or a diffusive reflector such as a white film (available from 3M Corporation) or a $TiO_2$ layer. The $TiO_2$ layer may be sprayed or spun on using a sol-gel process. Any organic binder may be heated to evaporate it. Other types of opaque or substantially opaque reflectors may also be used. If the reflector is a metal, it may be less than one micron thick and still be opaque to white light.

The resulting wafer is then diced using a laser or sawing 121. The major surface of each phosphor/window die will be equal to or greater than the major surface of the blue LED to which it will be affixed. Hundred or thousands of dice may be created by a single wafer.

Figure 15B:
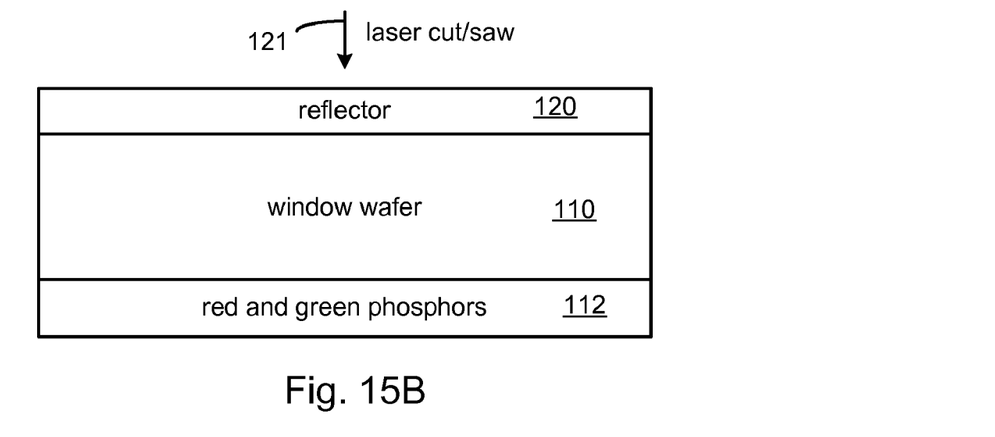
FIG. 15B illustrates the adding of a reflective layer over the window wafer, opposite to the phosphor layer surface, and the dicing of the wafer to form phosphor/window dice for bonding onto blue LEDs.

FIG. 15B is similar to FIG. 15A except that the reflector 120 is formed on a surface of the window wafer 110 opposite to the surface supporting the phosphor layer 112. The CCT of the white light using the structure of FIG. 15B is more uniform than the CCT using the structure of FIG. 15A due to better mixing in the window layer.

After dicing, the positions of the dice are held in place using a stretchable adhesive sheet. Using the CCT mapping data obtained in FIG. 14, a pick-and-place device then separates the dice into "bins" in accordance with their CCT. The term "bin" refers to the physical or virtual (in a memory) grouping together of dice having similar characteristics. Each bin is associated with a narrow range of CCTs. There may be three or more bins, labeled CCT1, CCT2, and CCT3 in FIG. 16.

Blue LEDs are fabricated on a wafer scale using conventional techniques. The blue LEDs, prior to singulation, are energized, tested for their peak emission wavelengths, and mapped. The LEDs are then singulated by laser, scribing and breaking, or sawing. The LEDs are then binned by grouping LEDs with similar peak wavelengths together. For example, each bin may have a 5 nanometer range. FIG. 16 shows three bins for the blue LEDs, labeled $\lambda 1$, $\lambda 2$, and $\lambda 3$.

Depending on the target CCT of the white light, the phosphor/window bins can be matched up with the LED bins so that their combined characteristics achieve the target CCT. This may be determined empirically or by simulation. FIG. 16 illustrates by the arrows the matching of the bins to obtain the target CCT. For example, an LED that emits a long peak wavelength of blue light, relative to the average blue peak wavelength, would be matched with a phosphor/window die that has a relatively high CCT to offset the long peak wavelength of the blue LED.

In FIG. 17A, the phosphor/window die 126 is affixed to the top surface of its matched blue LED. A layer of silicone, a layer of heated glass, silicon dioxide, or other adhesive may be used to affix the phosphor/window die 126 to the LED. In the case of silicone, the silicone is deposited as a liquid or gel over the blue LED, the phosphor/window die 126 is then positioned over the LED, and heat and pressure are applied until the silicone is cured. In one embodiment, heat and pressure create a sufficient bond between the phosphor/window die 126 and the LED. Optionally, the resulting structure may later be encapsulated in silicone to increase its structural integrity. Details of the LED are described with respect to FIG. 1, and the same element numbers are used. In FIG. 17A, the window wafer 110 is referred to as a window layer 110 since is has been singulated. The window layer 110 acts as a waveguide. In the example of FIG. 17A, the phosphor/window die 126 is larger than the LED. This eases the tolerance of the placement of the phosphor/window die 126 on the LED and the overhanging edges intercept upwardly directed blue light emitted from the sides of the LED.

The blue light from the LED passes through the window layer 110 and energizes the red and green phosphors. A high percentage of the blue light also passes through the phosphor layer 112 and is reflected back by the reflector 120 to energize the phosphors. Due to the scattering and mixing of light by the phosphors, reflector, and window layer, the blue, red, and green light will blend within the phosphor/window, and white light will be emitted from the sides of the phosphor/window die 126.

Due to the reflection of the blue light by the reflector 120, the phosphor layer 112 is exposed to a large quantity of energizing light, so the phosphor layer 112 can be made very thin yet still output sufficient red and green light components to produce white light with a high CCT.

FIG. 17B illustrates the phosphor/window die of FIG. 15B affixed to a blue LED, where the phosphor layer 112 is adjacent the LED, and the window layer 110 separates the phosphor from the reflector 120. The operation is similar to that of FIG. 17A. FIG. 17B appears to provide improved mixing of the light.

FIG. 18 illustrates an embodiment where a UV LED is used. Red, green, and blue phosphors are then used to create white light. The phosphors may be deposited in layers 130-132 or mixed into a single layer. In an alternative embodiment, the phosphors are located between the reflector 120 and the window layer 110.

Figure 19A:
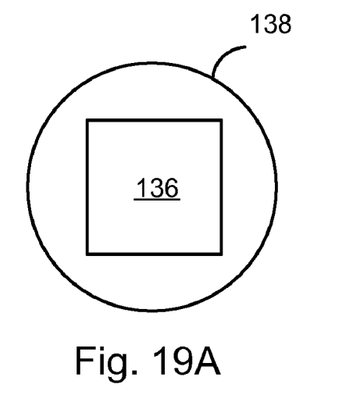
FIG. 19A is a top down transparent view illustrating a circular phosphor/window die over a rectangular LED.
Figure 19B:
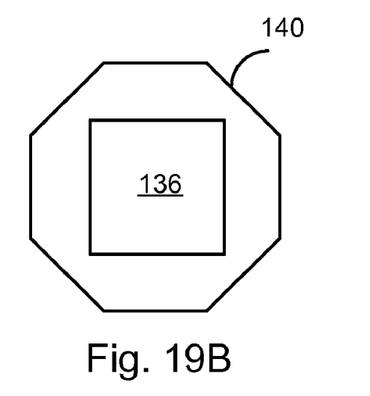
FIG. 19B is a top down transparent view illustrating a polygonal phosphor/window die over a rectangular LED.

In the above embodiments, the phosphor/window die has approximately the same rectangular shape as the LED. Since adjacent sides are at 90 degrees, light that is totally internally reflected, due to being less than the critical angle at the window/air interface, may repeatedly be reflected without exceeding the critical angle. FIGS. 19A and 19B illustrate embodiments of the phosphor/window die that are not rectangular to reduce the number of internal reflections in order to improve light extraction efficiency.

FIG. 19A is a top down view showing an LED die 136 with an overlying phosphor/window die 138. Any of the phosphor/window structures described herein may form the phosphor/window die 138. The phosphor/window die 138 is formed to be substantially circular so that more light impinges on the window/air interface at greater than the critical angle so as to be extracted without internal reflection.

FIG. 17B illustrates a polygonal phosphor/window die 140, which may be easier to form than a circular phosphor/window die. The angled sides increase the likelihood that the light impinges upon a side at greater than the critical angle. Any non-rectangular shape is represented by FIG. 17B.

FIGS. 20-23 illustrate enhancements to the basic phosphor/window structure to increase light extraction and/or light mixing. In these embodiments, the window layer separates the phosphor from the reflector, but in alternative embodiments the phosphor may be adjacent the reflector.

Figure 20:
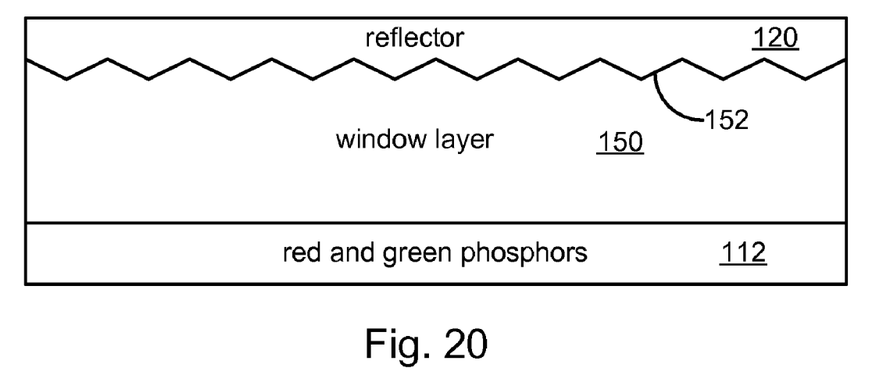
FIG. 20 is a cross-sectional view of a phosphor/window die with a Fresnel lens or scattering features formed at the window/reflector interface.

In FIG. 20, the surface of the window layer 150 is molded to create light scattering features 152, which direct the light toward the side walls of the structure for improve light extraction and mixing. The features 152 may also form a Fresnel lens. The features 152 are formed prior to singulation of the phosphor/window wafer. The reflector 120 may be a sputtered or evaporated metal or a paint.

Figure 21:
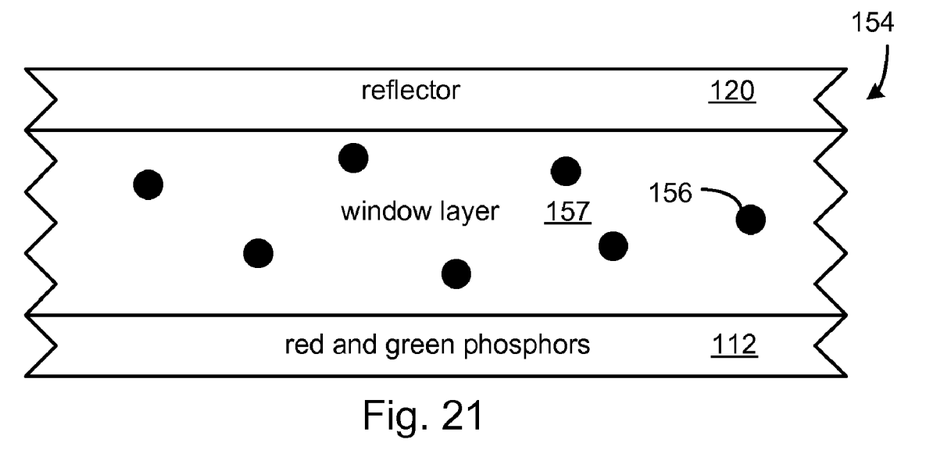
FIG. 21 is a cross-sectional view of a phosphor/window die with roughened sides for light scattering and scattering particles in the window layer.

In FIG. 21, the sides of the phosphor/window 154 are roughened by abrasion or another process. This causes more light to impinge on the side walls at greater than the critical angle for improved light extraction and improves mixing.

Also, light scattering particles or voids (generally referred to as light scattering features 156) are contained in the window layer 157 for redirecting the light to increase mixing and reduce the number of internal reflections. Light scattering particles may be $TiO_2$ particles embedded in a glass or ceramic window layer.

When the window layer is between the phosphor and the LED, there will be a difference in angular distribution of the blue versus red/green light from the phosphors depending on the height versus width ratio of the window layer. This may result in non-optimum mixing of the light and poor color uniformity versus viewing angle. The color mixing is improved using the various light scattering features describe above. Additional, mixing can be improved with external optics, such as a diffuser.

Figure 22:
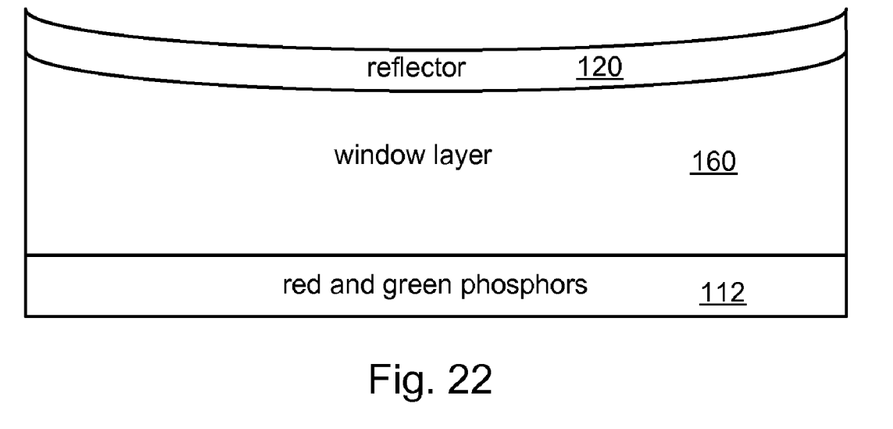
FIG. 22 is a cross-sectional view of a phosphor/window die with a curved lens shape at the window/reflector interface for reflecting light outward.

In FIG. 22, the window layer 160 is molded to form a concave lens shape. The reflector 120 is then deposited over the window layer to reflect light towards the side walls to improve light extraction. The molding is performed on the phosphor/window wafer prior to singulation.

Figure 23:
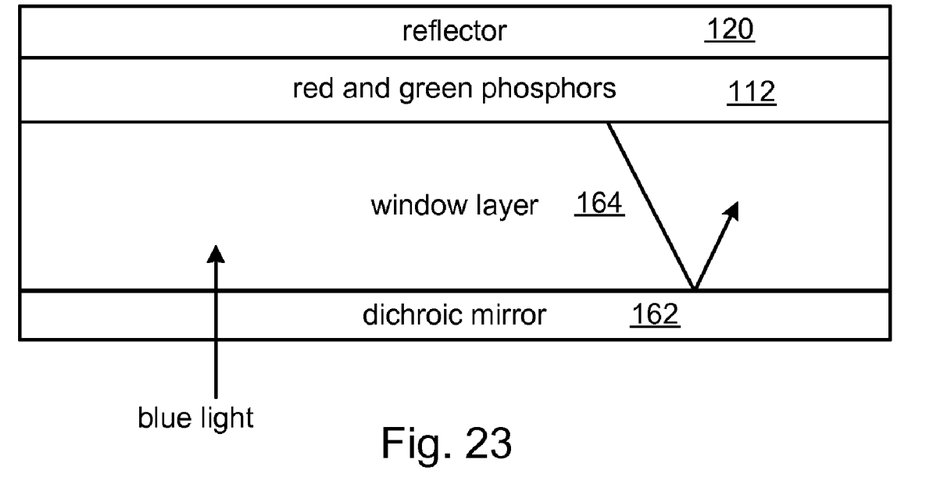
FIG. 23 is a cross-sectional view of a phosphor/window die including a dichroic mirror that allows blue light to pass but reflects red and green light.

In FIG. 23, a dichroic mirror 162 is formed on a surface of the window layer 164 to reduce absorption of light by the LED. The mirror 162 allows blue light to pass but reflects the red and green light components upward.

Any of the techniques described above for improving efficiency can be combined together.

Figure 24:
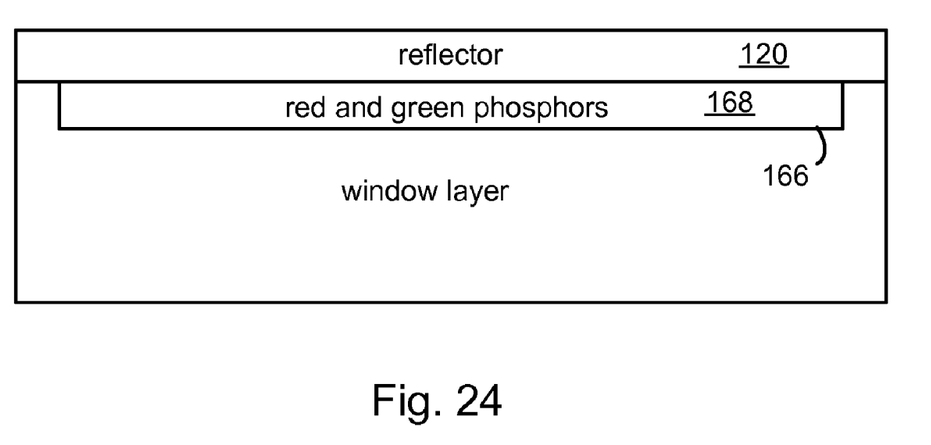
FIG. 24 is a cross-sectional view of a phosphor/window die with a tub formed in the window layer in which the phosphor is deposited.

FIG. 24 illustrates a manufacturing technique that ensures a more repeatable phosphor layer. The window wafer is molded to create shallow tubs 166 having precise dimensions. The phosphors 168 may be mixed in a slurry, and the tubs are filled with the slurry. After the slurry has dried, any phosphor above the rim of the tub may be polished away. The density of the phosphors can be much higher than if the phosphors were spun on or sprayed on. The reflector 120 is then formed over the window and phosphor.

The above techniques may be used with any type of phosphor (not just red and green) and any type of LED. It is preferable that the LED be a flip chip so that there are no wires interfering with the phosphor/window.

The side-emitting LEDs are particularly useful for thin backlights for LCDs or for general lighting applications. Any of the LEDs described herein may be used in the backlights described herein. The term side-emitting LEDs refers to LEDs where a majority of the light is emitted through one or more sides of the LED, rather than normal to the major surface of the active region.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A side-emitting light emitting device comprising:
   a light emitting diode (LED) die comprising:
   a first semiconductor layer of a first type;
   a second semiconductor layer of a second type;
   and active layer between the first semiconductor layer and the second semiconductor layer, the active layer having a major surface;
   a first electrode in contact with the first semiconductor layer; and
   a second electrode in contact with the second semiconductor layer, the first electrode and the second electrode being on a first side of the LED for being directly connected to electrodes on a submount, the LED being a flip chip;

the light emitting structure further comprising:
a window layer affixed to the LED die overlying the major surface of the active layer;
at least one phosphor layer coating a surface of the window layer for wavelength conversion of light emitted by the LED die; and
a reflector overlying a surface of the window layer, with the window layer and the at least one phosphor layer between the reflector and LED die, such that light emitted by the major surface of the active layer energizes the at least one phosphor layer, and the reflector substantially blocks light exiting the light emitting device normal to the major surface of the active layer such that a majority of light is emitted from sides of the light emitting device.

2. The device of claim 1 wherein the at least one phosphor layer and reflector are located on opposite surfaces of the window layer.

3. The device of claim 1 wherein the reflector is provided directly over the at least one phosphor layer.

4. The device of claim 1 wherein the window layer contains embedded light scattering features.

5. The device of claim 1 wherein the at least one phosphor layer comprises a single layer of mixed red and green phosphors.

6. The device of claim 1 wherein the at least one phosphor layer comprises a first layer of red phosphor and a second layer of green phosphor.

7. The device of claim 1 wherein the at least one phosphor layer comprises red, green, and blue phosphors.

8. The device of claim 1 wherein the LED die emits blue light.

9. The device of claim 1 wherein the LED die emits UV light.

10. The device of claim 1 wherein the window layer has a thickness greater than 100 microns, and the at least one phosphor layer has a thickness less than 50 microns.

11. The device of claim 1 wherein the at least one phosphor layer comprises at least two color phosphors in a transparent binder.

12. The device of claim 1 wherein the window layer has edges that extend over edges of the LED die.

13. The device of claim 1 wherein the window layer has scattering features in a surface adjacent the reflector.

14. The device of claim 1 wherein the LED die active layer is rectangular, and the window layer is non-rectangular and has edges that extend over edges of the LED die.

15. The device of claim 1 wherein the window layer has a concave surface adjacent the reflector.

16. The device of claim 1 further comprising a dichroic mirror between the LED die and the window layer, the dichroic mirror allowing light emitted from the LED die to pass and reflecting light emitted by the at least one phosphor layer.

17. The device of claim 1 wherein the at least one phosphor layer is within a tub formed in the window layer.

18. The device of claim 1 wherein sides of the window layer are roughened.

19. The device of claim 1 wherein the reflector is a diffusive reflector.

20. The device of claim 19 wherein the reflector is a substantially opaque layer comprising $TiO_2$.

* * * * *